July 22, 1969 GORDON KOWA CHENG CHEN 3,457,475

SEMICONDUCTOR DEVICE WITH INTEGRAL ELECTRODES, CONSTITUTING A UNITARY VITREOUS STRUCTURE

Filed Feb. 8, 1967

INVENTOR.
GORDON KOWA CHENG CHEN

BY Maybee & Legris

ATTORNEYS

United States Patent Office 3,457,475

Patented July 22, 1969

3,457,475

SEMICONDUCTOR DEVICE WITH INTEGRAL ELECTRODES, CONSTITUTING A UNITARY VITREOUS STRUCTURE

Gordon Kowa Cheng Chen, Toronto, Ontario, Canada (1976 Victoria Park Ave., Scarborough, Ontario, Canada)

Filed Feb. 3, 1967, Ser. No. 614,634
Int. Cl. H01l 5/00, 13/00, 7/00
U.S. Cl. 317—234 10 Claims

ABSTRACT OF THE DISCLOSURE

The invention provides a semiconductor device comprising as a unitary structure: a semiconductor body, a vitreous layer formed upon the semiconductor body, and electrodes which make electrical contact with different regions of the semiconductor body through windows in the vitreous layer. The electrodes are glazed conductors bonded to the vitreous layer and bonded to the regions of the semiconductor which they contact. The invention also provides a monolithic integrated electrical circuit or circuit element, in which a semiconductor is treated to provide one or more junction devices integrally formed within it, different regions of the junction devices being interconnected by glazed conductors which are bonded to a vitreous layer covering the semiconductor, the conductors contacting the regions through windows in the layer. The vitreous layer may be a passivation layer bonded to the semiconductor, or a composite layer consisting of a glass layer bonded to the surface of a passivation layer which is in turn bonded to the semiconductor. In making such a semiconductor device or electrical circuit, a vitreous layer is formed upon the surface of the semiconductor, windows are formed in the layer at one or more predetermined points to which one or more connections are to be made, and a glazed conductor is placed upon the layer with a part of the conductor contacting the semiconductor through the window or windows. The assembly is then fired to bond the glazed conductor to the layer and form a unitary structure.

This invention relates to semiconductor devices and to methods of making such devices.

A semiconductor device is an electronic device in which the characteristic distinguishing electronic conduction takes place within a semiconductor. Such device includes silicon and germanium transistors, rectifiers and gating switches, and the methods and structures described herein are applicable to all such devices.

An active semiconductor element is produced when at least one junction is formed in a semiconductor crystal, a junction being a transition region between two semiconducting regions with different electrical properties. The three principle processes for forming junctions are growing, alloying and diffusion, the last-mentioned process being particularly important on account of its suitability for large scale production.

In the known production of one type of silicon transistor by the diffusion process, for example, a p-type or n-type silicon crystal, usually about one inch in diameter and four to six inches in length, is cut into wafers of from 0.01 inch to 0.02 inch thick. The wafers are lapped and polished to a very fine surface finish. After careful cleaning a layer of silicon dioxide of from 4,000 to 20,000 angstrom units thick is grown on the surface of the wafer at a temperature of about 1000° C. This layer, herein referred to as a passivation layer, serves as a mask during subsequent diffusion processes. The area of semiconductor into which an impurity is to be diffused is exposed by selectively opening the passivation layer by etching with an etchant consisting of hydrofluoric and nitric acids; the etching pattern is produced by a photoresist method. On a single wafer many hundreds of such windows may be formed at the same time, the number of windows depending upon the number of semiconductor devices to be formed in the wafer. Junctions are formed by diffusing into the silicon body, at each of its exposed areas, an impurity material of opposite conductivity type to that of the silicon; for example, boron would be a suitable impurity material in the case of n-type silicon. Such diffusion is usually carried out at about 1000° C. to a depth of a few micro-inches. By reforming the oxide or passivation layer and forming other windows therein of smaller area than the first windows, and diffusing another impurity material through these windows, multiple junction devices such as n-p-n transistors, silicon controlled rectifiers, or gating switches, may be formed.

In the known techniques, before the electrical connections can be made it is necessary to reopen the passivation layer at the required positions and then a thin metallic film is deposited on the wafer surface, the metal being removed at those positions where electrical connections are not required. Thereafter the wafer is divided to separate the individual devices, which are treated individually. Electrical connections are made by welding very fine conducting leads to the deposited metal film, a protective glass layer having previously been formed over each device, and finally the devices are encapsulated.

Although the formation of the semiconductor devices is a highly efficient process, which can be carried out as a batch process, the provision of electrical connections and leads is very difficult. Moreover the electrical leads are extremely fragile and very vulnerable to damage.

The present invention provides an improved method of making electrical connections to semiconductor bodies, and it is an object of the invention to provide an improved semiconductor device in which the electrical connections are robust and an integral part of the device.

A further object of the invention is to provide a monolithic integrated electrical circuit or circuit element, comprising a semiconductor body having a plurality of junction devices and conducting leads integrally formed with it.

A semiconductor device according to the invention, comprises as a unitary structure, a semiconductor body, a vitreous layer formed upon and bonded to the semiconductor body, the vitreous layer having windows therein, and electrodes making electrical contact with different regions of the semiconductor body, the electrodes being constituted by glazed conductors bonded to the vitreous layer, the glazed conductors contacting and being bonded to the different regions of the semiconductor body through the windows.

By a "vitreous layer" is meant a layer of glass or glass-like material having the essential property that it is rigid at normal temperatures but can be softened by heating and bonded to another glass or vitreous layer by reacting with it chemically at an interface to form a unitary structure therewith.

In this specification the term "glazed conductor" means the glass or glass-like body formed by curing or firing a composition containing conductive particles, vitreous or glass forming components, and a binding medium, the glass or glass-like body being made conductive by its metal contents. Where the context permits, the term "glazed conductor" also includes a green glazed conductor, which is the composition prior to its being cured or fired.

Such a glazed conductor consists of conductive particles embedded in a glass matrix forming a vitreous body that is conductive to electricity. The material is usually formed by mixing metallic or metal oxide particles in pulverized glass or glass forming components, a binder being added to make a paste. The paste is applied to a base or substrate in a particular design by stencilling, brushing or spraying; the printed base or substrate is heated to melt the glass which, upon cooling, becomes a thin vitreous conductor firmly bonded to the base or substrate. The resistance of the conductor is determined primarily by its geometrical shape. The shape is usually obtained by printing the green glazed conductor through a stencil screen, or by cutting the cured film with abrasives, or by selectively etching away areas of the cured film by a photoresist process.

The invention will now be described, by way of example, with reference to the accompanying drawings, in which.

Figure 1:
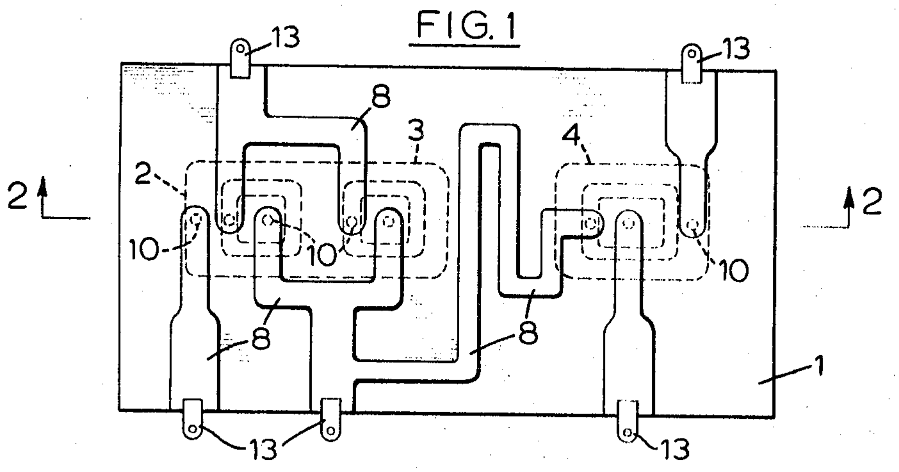
FIGURE 1 is a monolithic integrated electrical circuit comprising a semiconductor body having a plurality of junction devices integrally formed therewith, the devices being electrically connected.
Figure 2:
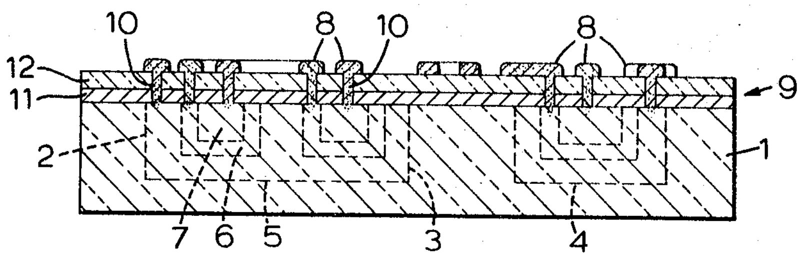
FIGURE 2 is a section of line 2—2 in FIGURE 1.

Referring to FIGURES 1 and 2, a monolithic integrated electrical circuit, providing two parallel connected transistors in series with a third transistor comprises a silicon body having three junction devices 2, 3 and 4 integrally formed therewith. Each junction device has a plurality of regions of different electrical characteristics, for example, the regions 5, 6 and 7 of the device 2, to which electrical connections are made at the surface of the body 1 by glazed conductors 8.

A vitreous layer 9 is formed upon and bonded to the surface of the body 1, and windows 10 are formed in the vitreous layer. The glazed conductors 8 extend through the windows 10 to contact the respective regions of the junction devices 2, 3 and 4 to which regions the conductors are bonded so as to provide electrical connections. The vitreous layer 9 of the present example is a composite layer consisting of a passivation layer 11 formed upon and bonded to the surface of the body 1, and a glass layer 12 bonded to the passivation layer, the windows 10 extending through both layers. The glazed conductors 8 are in turn bonded to the glass layer 12, with which they form a unitary vitreous structure.

The passivation layer 11 may consist of silicon oxide formed upon the silicon body during the final diffusion step, or by an additional step of oxidation by thermal growth. Alternatively the passivation layer may be deposited by evaporation or reactive sputtering. The passivation layer need not be of silicon oxide, but may be of any vitreous material, such as silicon nitride or certain glasses, which can be readily bonded to the semiconductor 1 and to the glass layer 12.

In the manufacture of the device shown in FIGURES 1 and 2, a wafer of p-type silicon, or other semiconducting material having p-type or n-type properties, is formed with a large number of double diffused junctions by the diffusion method described above. The wafer is separable into separate elements, each element including three double diffused junctions corresponding to the three junction devices 2, 3 and 4. A passivation layer is formed upon the surface of the semiconductor body to a thickness of at least 4000 angstrom units at its thinnest place.

A layer of glass is next formed upon the passivation layer. The glass layer, which is only a few micro-inches thick, may be formed by applying pulverized glass particles of 0.1 micron average size, the particles being deposited from a liquid carrier such as ethyl-acetate and isopropyl alcohol by spin coating or sedimentation. The glass layer is made vitreous and firmly bonded to the passivation layer by known glass processing techniques. The glass of the layer 12 is selected so that its coefficient of thermal expansion will match that of the passivation layer; this does not require that the two coefficients shall be equal, but only that their difference shall not be so great as to produce excessive strain at the interface between the layers. This consideration limits the thickness of the glass layer applied. Many commercially available glasses may be used; for example, an aluminosilicate glass similar to the Corning code 1720 having a coefficient of thermal expansion of $42\times10^{-7}/°$ C., a density of 2.5 gm./cm.$^3$, and a softening point of about 900° C., is suitable in the case of a silicon dioxide passivation layer grown thermally in dry oxygen.

The windows 10 are formed in the vitreous layer 9 at those points at which electrical connections are to be made to the collectors, bases, and emitter regions of the junction devices. The windows are formed by removing glass from the vitreous layer by etching so as to expose the surface of the semiconductor body. A photoresist technique is used to mask the wafer. The etching can be performed by immersion in 1.8 molar hydrofluoric acid, or exposure to hydrofluoric acid vapour.

The next step is to prepare and apply green glazed conductors to the surface of the glass layer. The conductor material is prepared in accordance with the standard practice, but the selection of the glass matrix material and the conductive particles is critical. The glass matrix material must be compatible with the glass layer 12 as well as with the conductive particles it contains. The conductive particles must be chemically stable and inert to normal atmosphere, and for this reason noble metals are preferred. In order to obtain ohmic as opposed to rectifying contacts, platinum is preferred to gold. Depending upon the material of the semiconductor body 1, the metal particles may be selected from gold, silver, platinum, or osmium. Commercial glasses, such as the Corning pyroceram with a softening point of 400° C. may be used but generally a boro-silicate glass having a density of 2.1 gm./cm.$^3$, a coefficient of thermal expansion of $32\times10^{-7}$ ° C., and a softening point of 700° C., is preferred.

The matrix glass and metallic components are reduced to particles of one micro-inch average size and are formed into a thin paste, or green glaze, by adding an organic carrier such as nitrocellulose diluted with amyl acetate. The green glaze is applied to the surface of the wafer, by a stencilling or photoresist technique, to form the pattern of connections shown in FIGURE 1. The ends of the glazed conductors extend through the windows 10 and contact the exposed areas of the semiconductor at the points to which electrical connections are to be made.

The assembly so formed is next cured or fired at a temperature above 600° C. in normal atmosphere. The curing process results in the formation of a unitary structure, in which the semiconductor body is hermetically sealed within a vitreous mass. The bonds between the glazed conductors, the glass layer 12, the passivation layer 11, and the surface of the semiconductor body, are achieved by chemical reaction at their respective interfaces. Each interface becomes a transition region as a result of the curing step, the glazed conductors becoming an integral part of the glazed structure, and a part of each conductor, namely the metallic particles, providing ohmic contact with the semiconductor.

The wafer can now be broken into individual elements or transistors of the form shown in FIGURES 1 and 2, metal terminals such as 13 being soldered to the glazed conductors 8 to provide external electrical connections.

The glazed conductors need not be applied to the surface of the vitreous layer as green glaced conductors, but may have been pre-fired. In such a case subsequent firing of the assembly will bond the glazed conductors to the vitreous layer. In order to prevent exposure of the semiconductor surface when the windows 10 are formed, the passivation layer may remain unbroken, particularly if the passivation layer is an oxide layer such as silicon oxide. In that case, during firing of the assembly, the metallic particles of the glazed conductors are dispersed through the passivation layer into the semiconductor, the parts of the passivation layer beneath the windows of the glass layer becoming transition regions between the conductors and the silicon body.

Figure 3:
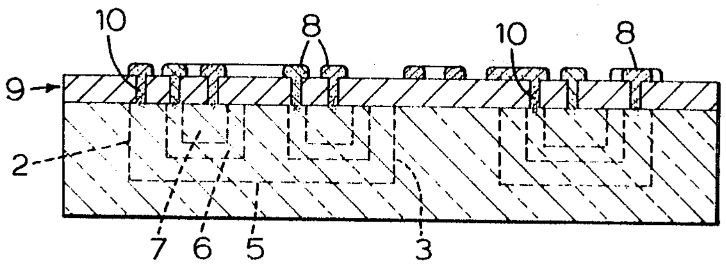
FIGURE 3 is a section corresponding to that of FIGURE 2, of a slightly modified structure.

Referring now to FIGURE 3, this figure shows in section a slightly modified device, which differs from the device shown in FIGURES 1 and 2 only insofar as the vitreous layer 9 consists of a single passivation layer formed upon and bonded to the surface of the semiconductor. In this particular structure the semiconductor is silicon and the passivation layer 9 is silicon nitride. The windows 10 are formed in the passivation layer to expose the appropriate regions of the semiconductor surface, and the glazed conductors are bonded to the semiconductor and to the vitreous layer in the manner described above. It is important in this case that the metallic particles of the glazed conductors should not become dispersed into the passivation layer making the latter conductive, and it is for that reason that silicon nitride is preferred as the passivation layer. Other materials may be used for the passivation layer, silicon oxide for example, providing the metallic component of the glazed conductors will not become dispersed into the passivation layer.

The electrodes provided on the devices made in accordance with the present invention, are because of their strong adhesion to the semiconductor, better and more reliable than the conventional electrodes commonly provided. The more massive glazed conductor has a lower resistance and greater current carrying capacity than a conventional thin film-thin wire electrode. Since the glazed conductor makes contact with the semiconductor over the entire terminal area, there is less current concentration and less chance of forming hot spots. The surface leakage current is reduced and the breakdown voltage increase, because the vitreous layer together with the glazed conductors provide a complete hermetic seal over the surface of the semiconductor. The device is better suited to withstand shock, vibration, and thermal cycling: it is stronger than a a comparable device of conventional manufacture, and lighter because of the elimination of a mounting header.

From a manufacturing point of view devices made in accordance with the invention are well suited to automated mass production techniques, whereas conventional devices are not so suited because of their inherent fragility.

What I claim as my invention is:

1. A semiconductor device comprising, as a unitary structure, a semiconductor body, a vitreous layer formed upon and bonded to the semiconductor body, the vitreous layer having windows therein, and electrodes making electrical contact with different regions of the semiconductor body, wherein the electrodes are constituted by glazed conductors bonded to the vitreous layer, the glazed conductors contacting and being bonded to the different regions of the semiconductor body through said windows.

2. A semiconductor device according to claim 1, wherein the vitreous layer comprises a passivation layer bonded to the semiconductor body and a layer of glass bonded to the passivation layer.

3. A semiconductor device according to claim 1, wherein the vitreous layer is constituted by a passivation layer bonded to the semiconductor body, the passivation layer insulating the glazed conductors from the semiconductor body except at said windows.

4. A semiconductor device according to claim 3, wherein the semiconductor body is of silicon and the passivation layer is of silicon nitride.

5. A monolithic integrated electrical circuit comprising a semiconductor body having a plurality of junction devices integrally formed therewith, each junction device having a plurality of regions of different electrical characteristics, a vitreous layer formed upon and bonded to the surface of the semiconductor body, and conductors interconnecting the junction devices in an electrical circuit, wherein the conductors are glazed conductors bonded to the vitreous layer, the vitreous layer having windows therein, and the glazed conductors contacting and being bonded to the different regions of the semiconductor body through the windows.

6. A monolithic integrated electrical circuit according to claim 5, wherein the vitreous layer comprises a passivation layer bonded to the semiconductor body and a layer of glass bonded to the passivation layer.

7. A monolithic integrated electrical circuit according to claim 5 wherein the vitreous layer is constituted by a passivation layer bonded to the semiconductor body, the passivation layer insulating the glazed conductors from the semiconductor body except at said windows.

8. A monolithic integrated electrical circuit according to claim 5, wherein the semiconductor body is of silicon and the passivation layer is of silicon nitride.

9. A method of making an electrical connection to a semiconductor body, the body having a vitreous layer formed upon and bonded to its surface, which method comprises forming a window in the vitreous layer at a predetermined point thereof to expose the surface of the body, assembling a glazed conductor with the semiconductor body by locating the glazed conductor upon the vitreous layer with a part of the conductor extending through the window into contact with the semiconductor body, and firing the assembly to bond the glazed conductor to the vitreous layer and to unite the glazed conductor with the exposed surface of the semiconductor body.

10. The method claimed in claim 9, wherein the glazed conductor is a green glazed conductor prior to firing.

References Cited

UNITED STATES PATENTS

| | | | |
|---|---|---|---|
| 3,037,180 | 5/1962 | Linz | 338—327 |
| 3,379,584 | 4/1968 | Bean et al. | 148—175 |

JOHN W. HUCKERT, Primary Examiner

R. SANDLER, Assistant Examiner

U.S. Cl. X.R.

29—569; 317—235